(12) United States Patent
Wang et al.

(10) Patent No.: US 10,163,854 B2
(45) Date of Patent: *Dec. 25, 2018

(54) PACKAGE STRUCTURE AND METHOD FOR MANUFACTURING THEREOF

(71) Applicant: TAIWAN SEMICONDUCTOR MANUFACTURING CO., LTD., Hsinchu (TW)

(72) Inventors: Chuei-Tang Wang, Taichung (TW); Kai-Chiang Wu, Hsinchu (TW); Chieh-Yen Chen, Taipei (TW); Yen-Ping Wang, Changhua County (TW); Shou-Zen Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/803,673

(22) Filed: Nov. 3, 2017

(65) Prior Publication Data

US 2018/0061808 A1 Mar. 1, 2018

Related U.S. Application Data

(63) Continuation of application No. 15/229,711, filed on Aug. 5, 2016, now Pat. No. 9,818,722.

(51) Int. Cl.
*H01L 25/065* (2006.01)
*H01L 25/00* (2006.01)
(Continued)

(52) U.S. Cl.
CPC ........ *H01L 25/0652* (2013.01); *H01L 21/565* (2013.01); *H01L 23/5389* (2013.01); *H01L 23/552* (2013.01); *H01L 24/19* (2013.01); *H01L 24/20* (2013.01); *H01L 25/03* (2013.01); *H01L 25/50* (2013.01); *H01L 21/568* (2013.01); *H01L 23/3128* (2013.01); *H01L 2224/04105* (2013.01); *H01L 2224/12105* (2013.01); *H01L 2224/16227* (2013.01); *H01L 2224/24137* (2013.01); *H01L 2224/73267* (2013.01); *H01L 2224/81005* (2013.01); *H01L 2224/92244* (2013.01); *H01L 2224/97* (2013.01);
(Continued)

(58) Field of Classification Search
CPC .................................................. H01L 25/0652
See application file for complete search history.

(56) References Cited

U.S. PATENT DOCUMENTS 7,732,252 B2 6/2010 Chow et al.
7,732,907 B2 6/2010 Han et al.
(Continued)

*Primary Examiner* — William Coleman
(74) *Attorney, Agent, or Firm* — Maschoff Brennan

(57) ABSTRACT

A package structure includes a package, at least one second molding material, and at least one electronic component. The package includes at least one first semiconductor device therein, a first molding material, at least one dielectric layer and at least one redistribution line. The first molding material is at least in contact with at least one sidewall of the first semiconductor device. The dielectric layer is over the first semiconductor device and the first molding material. The redistribution line is present at least partially in the dielectric layer and is electrically connected to the first semiconductor device. The second molding material is present on the package. The electronic component is present on the package and is external to the second molding material.

20 Claims, 22 Drawing Sheets

(51) Int. Cl.
*H01L 21/56* (2006.01)
*H01L 23/538* (2006.01)
*H01L 23/552* (2006.01)
*H01L 23/00* (2006.01)
*H01L 25/03* (2006.01)
*H01L 23/31* (2006.01)

(52) U.S. Cl.
CPC ............ *H01L 2225/06517* (2013.01); *H01L 2225/06537* (2013.01); *H01L 2225/06548* (2013.01); *H01L 2225/06558* (2013.01); *H01L 2225/06572* (2013.01); *H01L 2225/06582* (2013.01); *H01L 2924/15311* (2013.01); *H01L 2924/1815* (2013.01); *H01L 2924/3025* (2013.01)

(56) References Cited

U.S. PATENT DOCUMENTS

| | | |
|---|---|---|
| 8,304,869 B2 | 11/2012 | Camacho et al. |
| 8,558,392 B2 | 10/2013 | Chua et al. |
| 9,293,358 B2 | 3/2016 | Yang et al. |
| 9,527,723 B2 | 12/2016 | Lin et al. |

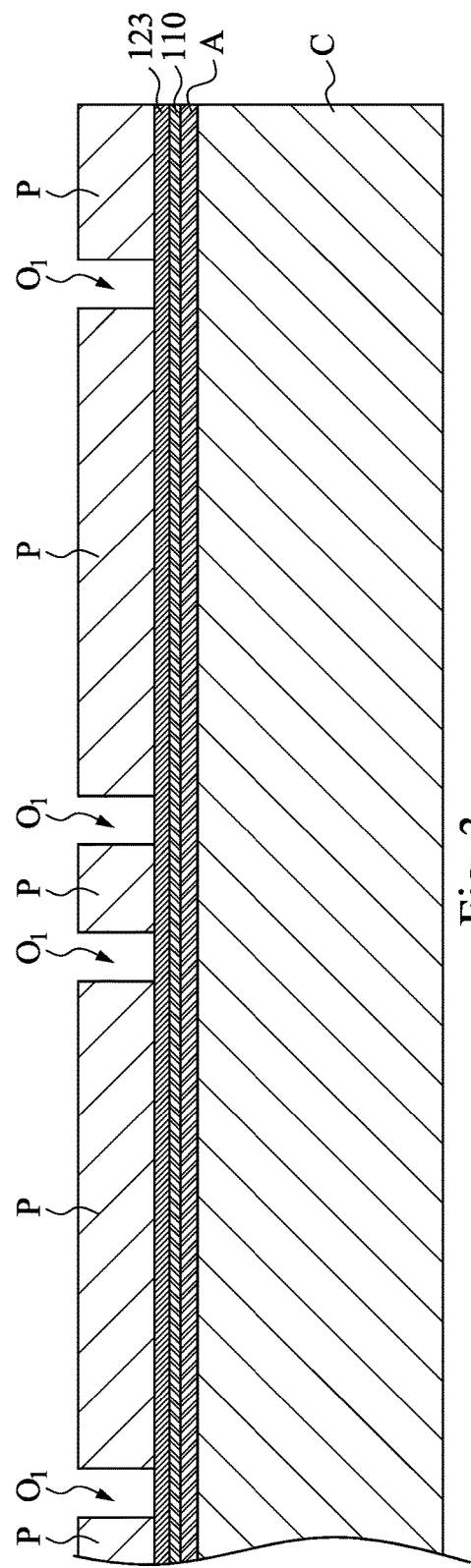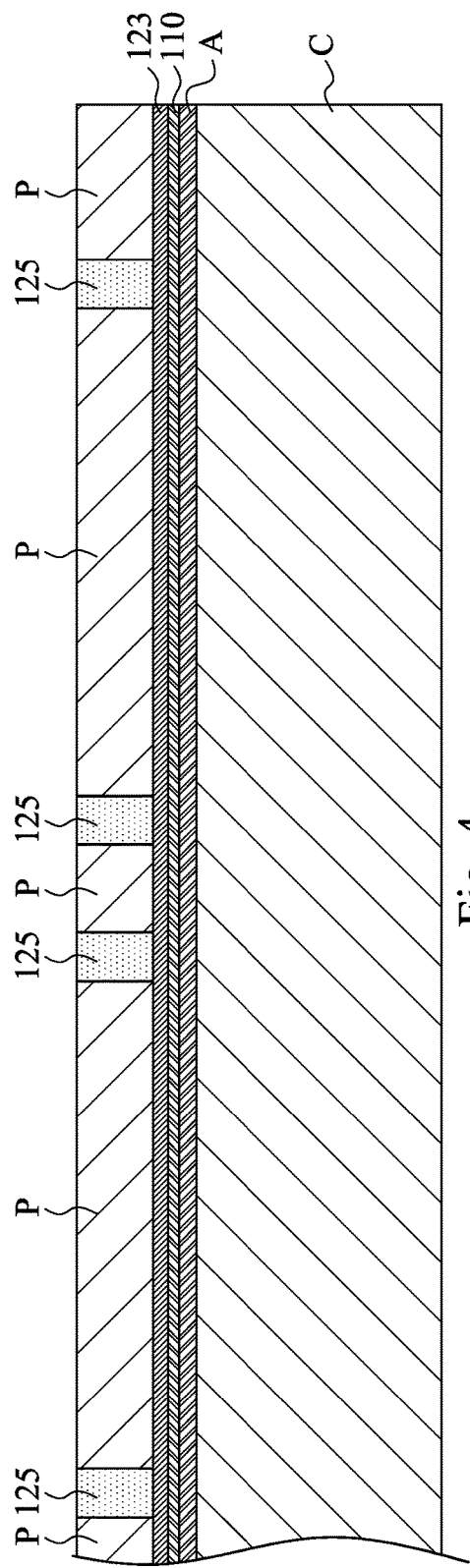

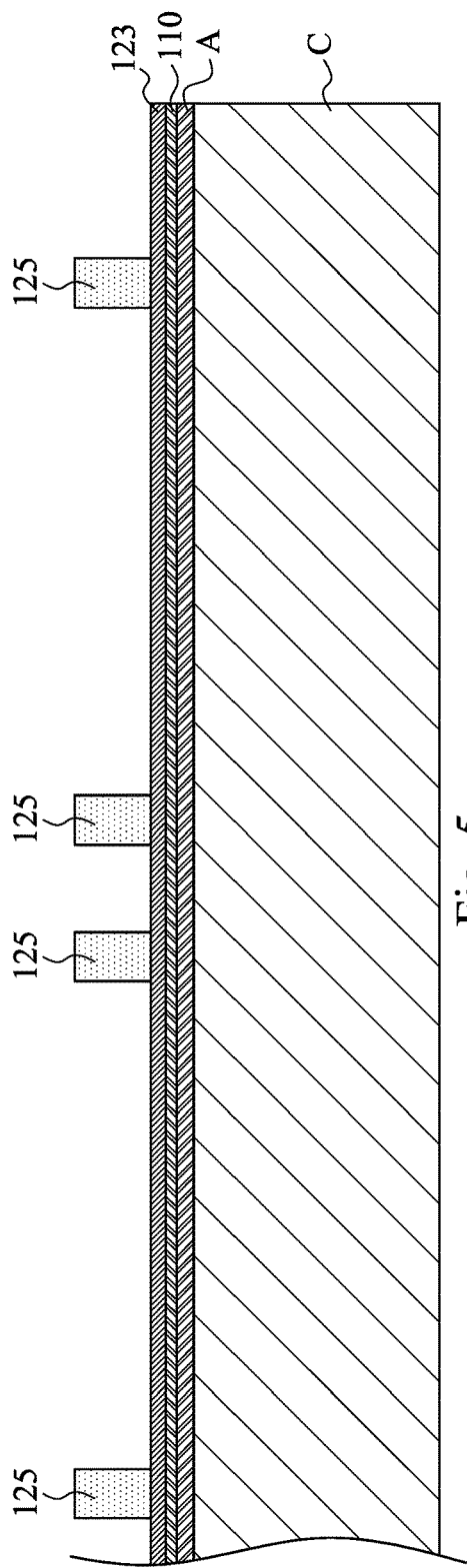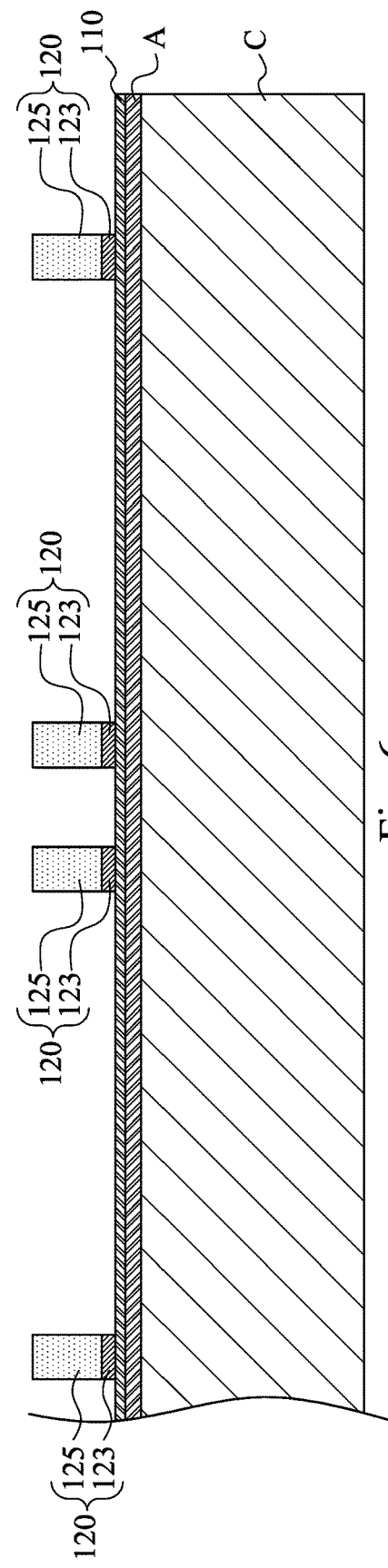

PACKAGE STRUCTURE AND METHOD FOR MANUFACTURING THEREOF

PRIORITY CLAIM AND CROSS-REFERENCE

The present application is a continuation application of U.S. application Ser. No. 15/229,711, filed Aug. 5, 2016, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bump-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-19 are cross-sectional views of intermediate stages in the manufacturing of a package structure in accordance with some embodiments of the present disclosure.

DETAILED DESCRIPTION

Figure 1:
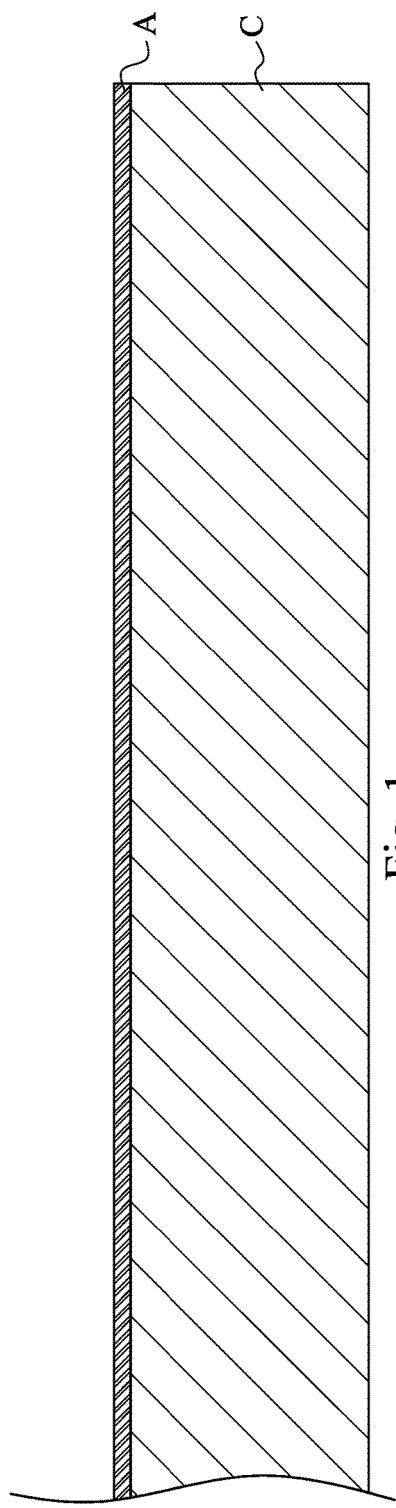

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-19 are cross-sectional views of intermediate stages in the manufacturing of a package structure in accordance with some embodiments of the present disclosure. Referring to FIG. 1, an adhesive layer A is formed on a carrier C. The carrier C may be a blank glass carrier, a blank ceramic carrier, or the like. The adhesive layer A may be made of an adhesive, such as ultra-violet (UV) glue, light-to-heat conversion (LTHC) glue, or the like, although other types of adhesives may be used.

Figure 2:
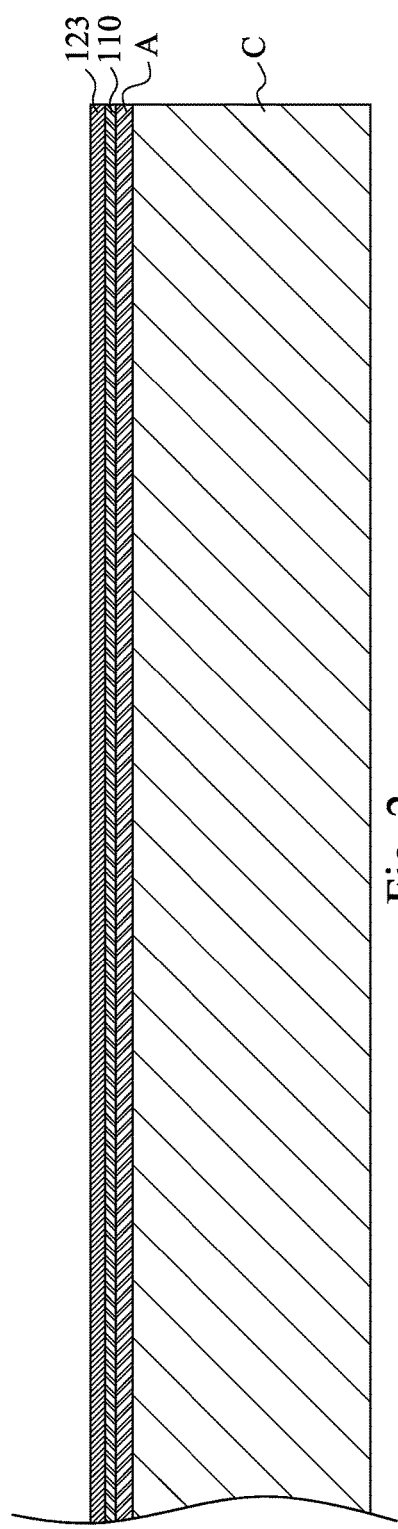

Referring to FIG. 2, a buffer layer 110 is formed over the adhesive layer A. The buffer layer 110 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 110 is a substantially planar layer having a substantially uniform thickness, in which the thickness may be greater than about 2 µm, and may be in a range from about 2 µm to about 40 µm. In some embodiments, top and bottom surfaces of the buffer layer 110 are also substantially planar.

A seed layer 123 is formed on the buffer layer 110, for example, through physical vapor deposition (PVD) or metal foil laminating. The seed layer 123 may include copper, copper alloy, aluminum, titanium, titanium alloy, or combinations thereof. In some embodiments, the seed layer 123 includes a titanium layer and a copper layer over the titanium layer. In alternative embodiments, the seed layer 123 is a copper layer.

Referring to FIG. 3, a photo resist P is applied over the seed layer 123 and is then patterned. As a result, openings $O_1$ are formed in the photo resist P, through which some portions of the seed layer 123 are exposed.

As shown in FIG. 4, conductive features 125 are formed in the photo resist P through plating, which may be electro plating or electro-less plating. The conductive features 125 are plated on the exposed portions of the seed layer 123. The conductive features 125 may include copper, aluminum, tungsten, nickel, solder, or alloys thereof. Top-view shapes of the conductive features 125 may be rectangles, squares, circles, or the like. Heights of the conductive features 125 are determined by the thickness of the subsequently placed first semiconductor devices 130 (FIG. 7), with the heights of the conductive features 125 greater than the thickness of the first semiconductor devices 130 in some embodiments of the present disclosure. After the plating of the conductive features 125, the photo resist P is removed, and the resulting structure is shown in FIG. 5. After the photo resist P is removed, some portions of the seed layer 123 are exposed.

Referring to FIG. 6, an etch step is performed to remove the exposed portions of seed layer 123, wherein the etch step may include an anisotropic etching. Some portions of the seed layer 123 that are covered by the conductive features 125, on the other hand, remain not etched. Throughout the description, the conductive features 125 and the remaining underlying portions of the seed layer 123 are in combination referred to as through integrated fan-out (InFO) vias (TIVs) 120, which are also referred to as through-vias 120. Although the seed layer 123 is shown as a layer separate from the conductive features 125, when the seed layer 123 is made of a material similar to or substantially the same as the respective overlying conductive features 125, the seed layer 123 may be merged with the conductive features 125 with no distinguishable interface therebetween. In alternative embodiments, there exist distinguishable interfaces between the seed layer 123 and the overlying conductive features 125.

Figure 7:
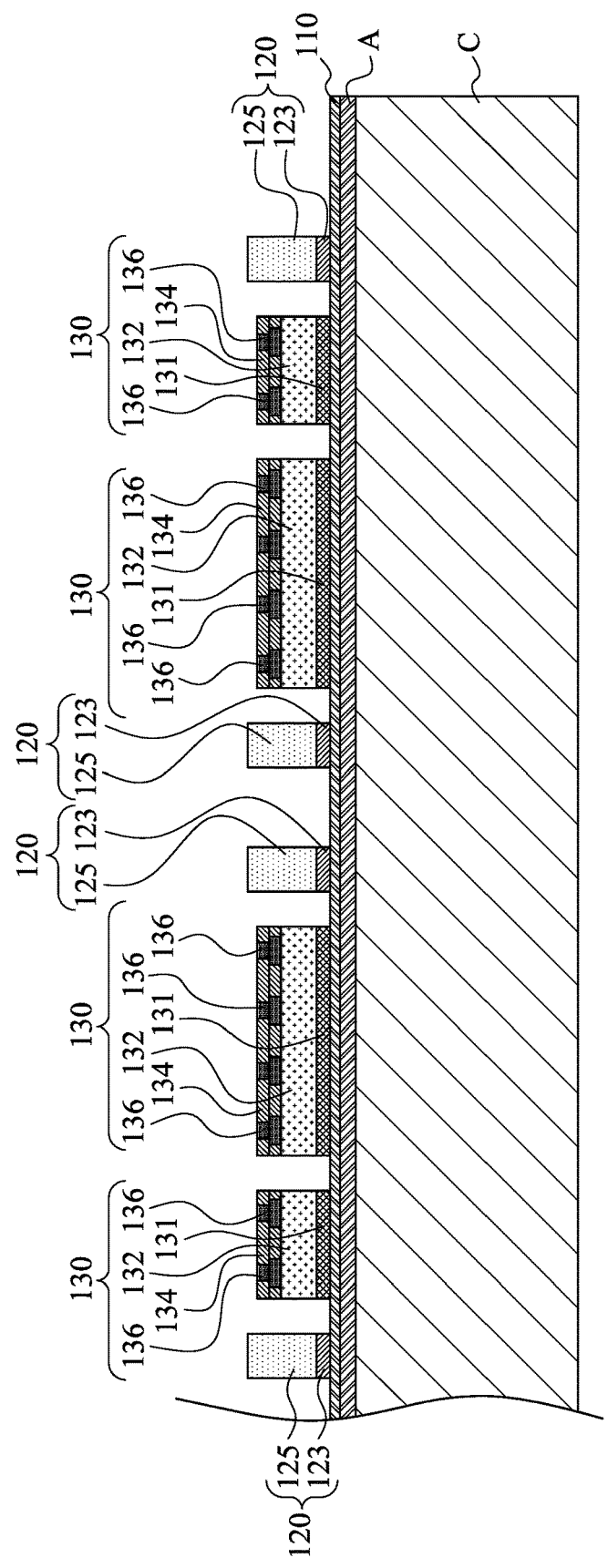

FIG. 7 illustrates placement of first semiconductor devices 130 over the buffer layer 110. The first semiconductor devices 130 may be adhered to the buffer layer 110 through adhesive layers 131. In some embodiments, the first semiconductor devices 130 are unpackaged semiconductor devices, i.e. device dies. For example, the first semiconductor devices 130 may be logic device dies including logic transistors therein. In some exemplary embodiments, the first semiconductor devices 130 are designed for mobile applications, and may be central computing unit (CPU) dies, power management integrated circuit (PMIC) dies, transceiver (TRX) dies, or the like. Each of the first semiconductor devices 130 includes a semiconductor substrate 132 (a silicon substrate, for example) that contacts the adhesive layer 131, wherein the back surface of the semiconductor substrate 132 is in contact with the adhesive layer 131.

In some exemplary embodiments, conductive pillars 136 (such as copper posts) are formed as the top portions of the first semiconductor devices 130, and are electrically coupled to the subsidiary devices such as transistors (not shown) in the first semiconductor devices 130. In some embodiments, a dielectric layer 134 is formed on the top surface of the respective first semiconductor device 130, with the conductive pillars 136 having at least lower portions in the dielectric layer 134. The top surfaces of the conductive pillars 136 may be substantially level with the top surfaces of the dielectric layers 134 in some embodiments. Alternatively, the dielectric layers are not formed, and the conductive pillars 136 protrude from a top dielectric layer (not shown) of the respective first semiconductor devices 130.

Figure 8:
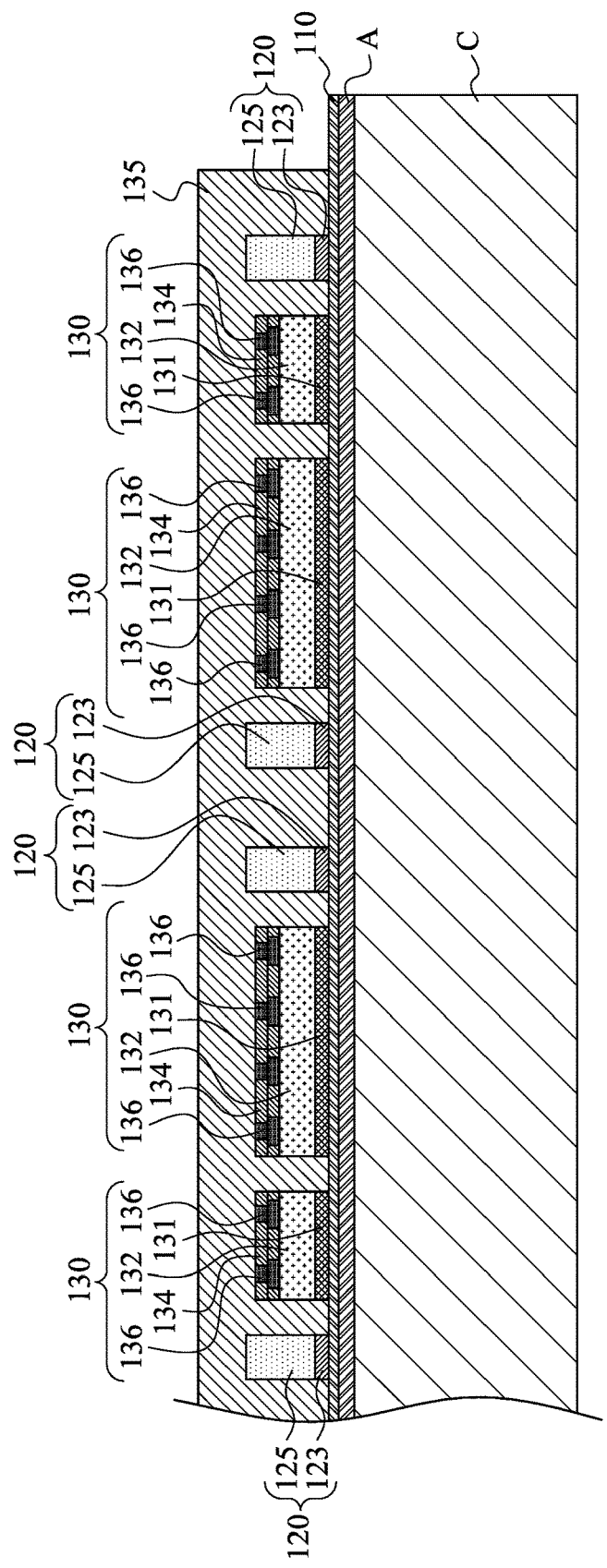

Referring to FIG. 8, a molding material 135 is molded on the first semiconductor devices 130 and the TIVs 120. The molding material 135 fills gaps between the first semiconductor devices 130 and the TIVs 120, and may be in contact with the buffer layer 110. Furthermore, the molding material 135 is filled into gaps between the conductive pillars 136 when the conductive pillars 136 are protruding metal pillars (this arrangement is not shown). The top surface of the molding material 135 is higher than the top ends of the conductive pillars 136 and the TIVs 120.

In some embodiments, the molding material 135 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 9:
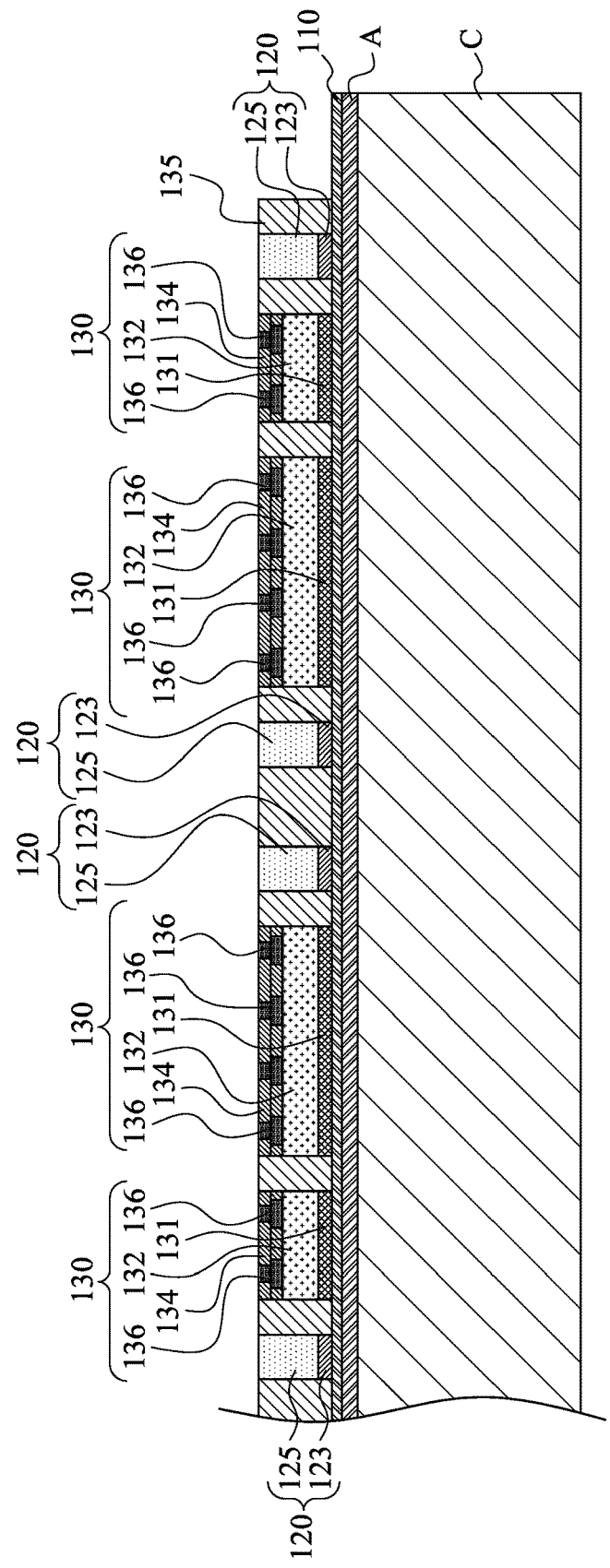

Next, a grinding step is performed to thin the molding material 135, until the conductive pillars 136 and the TIVs 120 are exposed. The resulting structure is shown in FIG. 9, in which the molding material 135 is in contact with sidewalls of the first semiconductor devices 130 and the TIVs 120. Due to the grinding, the top ends of the TIVs 120 are substantially level (coplanar) with the top ends of the conductive pillars 136, and are substantially level (coplanar) with the top surface of the molding material 135. As a result of the grinding, conductive residues such as metal particles may be generated, and left on the top surface of the structure shown in FIG. 9. Accordingly, after the grinding, a cleaning may be performed, for example, through a wet etching, so that the conductive residues are removed.

Figure 10:
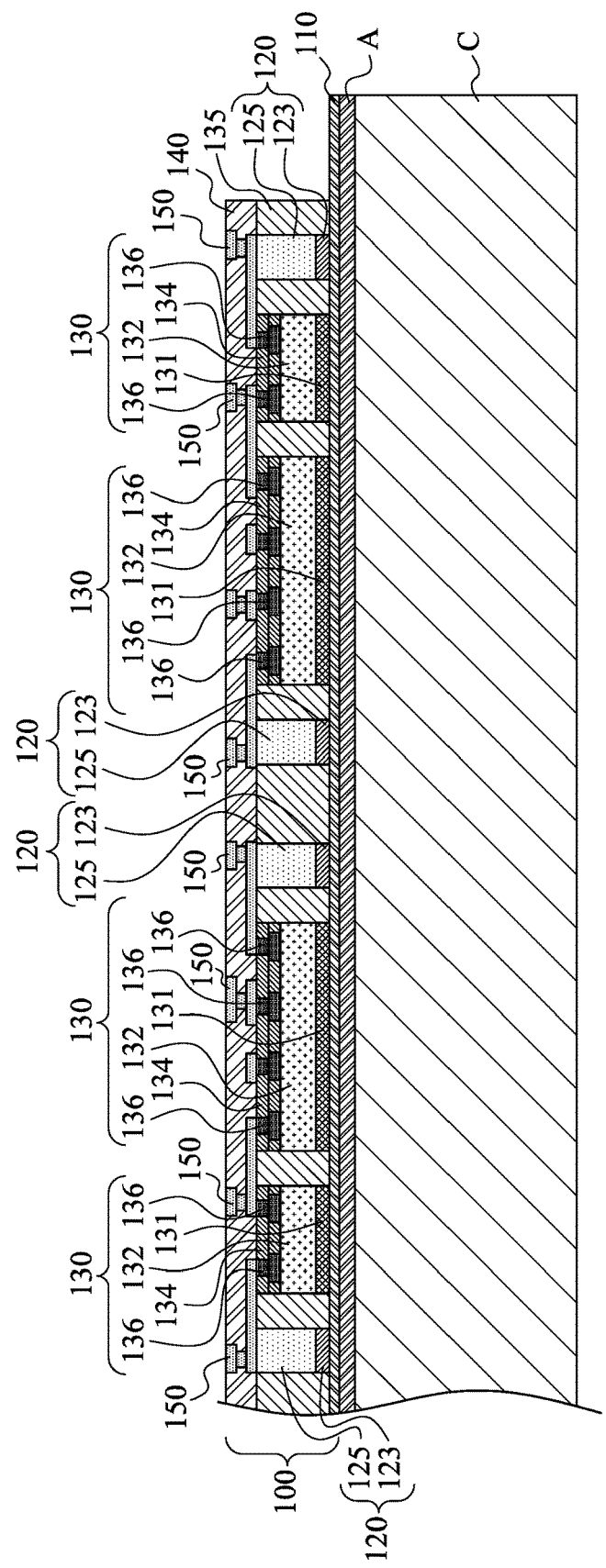

Next, referring to FIG. 10, redistribution lines (RDLs) 150 are formed over the molding material 135 to connect to the conductive pillars 136 and the TIVs 120. The RDLs 150 may also interconnect the conductive pillars 136 and the TIVs 120. In accordance with various embodiments, one or a plurality of the dielectric layers 140 are formed over the first semiconductor devices 130, the molding material 135 and the TIVs 120, with the RDLs 150 formed in the dielectric layers 140. In some embodiments, the formation of one layer of the RDLs 150 includes forming a blanket copper seed layer, forming and patterning a mask layer over the blanket copper seed layer, performing a plating to form the RDLs 150, removing the mask layer, and performing a flash etching to remove the portions of the blanket copper seed layer not covered by the RDLs 150. In alternative embodiments, the RDLs 150 are formed by depositing metal layers, patterning the metal layers, and filling gaps between the RDLs 150 with the dielectric layers 140. The RDLs 150 may include a metal or a metal alloy including aluminum, copper, tungsten, and/or alloys thereof. Throughout the description, the combined structure including the buffer layer 110, the first semiconductor devices 130, the TIVs 120, the molding material 135, the RDLs 150, and the dielectric layers 140 is referred to as a TIV package 100, which may be a composite wafer.

FIG. 10 illustrates two layers of the RDLs 150, while there may be one or more than two layers of the RDLs 150, depending on the routing design of the respective package. The dielectric layers 140 in these embodiments may include a polymer such as polyimide, benzocyclobutene (BCB), polybenzoxazole (PBO), or the like. Alternatively, the dielectric layers 140 may include non-organic dielectric materials such as silicon oxide, silicon nitride, silicon carbide, silicon oxynitride, or the like.

Figure 11:
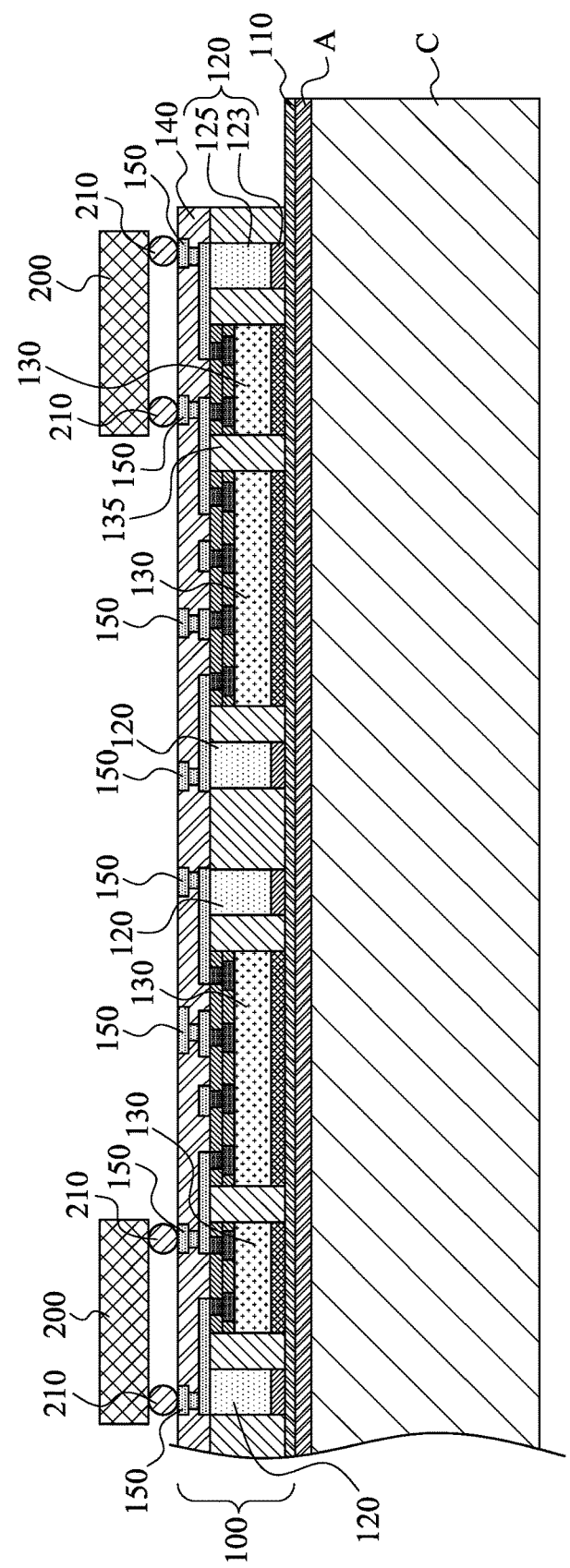

Next, referring to FIG. 11, second semiconductor devices 200 are attached to the TIV package 100. External connectors 210 of the second semiconductor devices 200 are bonded to some exposed portions of the RDLs 150. In some exemplary embodiments, the second semiconductor devices 200 are designed for mobile applications, and may be communication modules, such as Wi-Fi front-end modules, 5th generation mobile networks (5G) front-end modules, or the like. In some embodiments, the second semiconductor devices 200 are packaged semiconductor devices, i.e. device packages. In alternative embodiments, the second semiconductor devices 200 are unpackaged semiconductor devices, i.e. device dies. In some embodiments, the external connectors 210 of the second semiconductor devices 200 may be, for example, solder balls applied to the bottoms of the second semiconductor devices 200.

Figure 12:
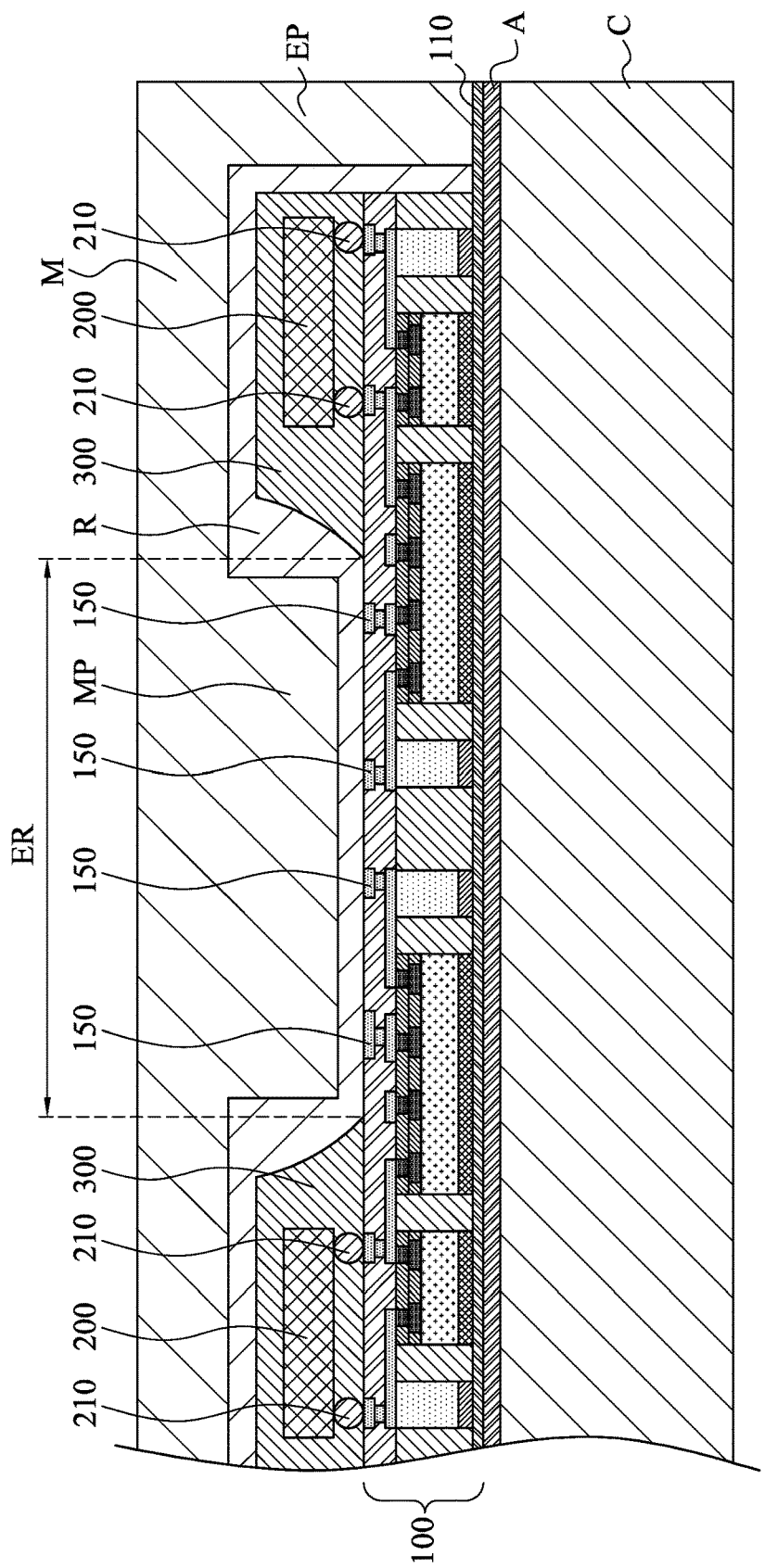

Referring to FIG. 12, a mold chase M is placed on, and is pressed against the TIV package 100 and the carrier C, for example, through clamping. In some embodiments, the mold chase M includes at least one protrusion MP that extends down to be pressed against at least one region ER where electronic components 400 (FIG. 18) are to be placed. Meanwhile, at least an edge portion EP of the mold chase M is in contact with the buffer layer 110. In some embodiments, a release film R, which is made of a flexible material, is attached to the inner surface of the mold chase M. The mold chase M may be made of stainless steel, ceramics, copper, aluminum, or the like. In the embodiments shown in FIG. 12, the mold chase M is at the wafer scale, in which the second semiconductor devices 200 are molded simultaneously.

Figure 14:
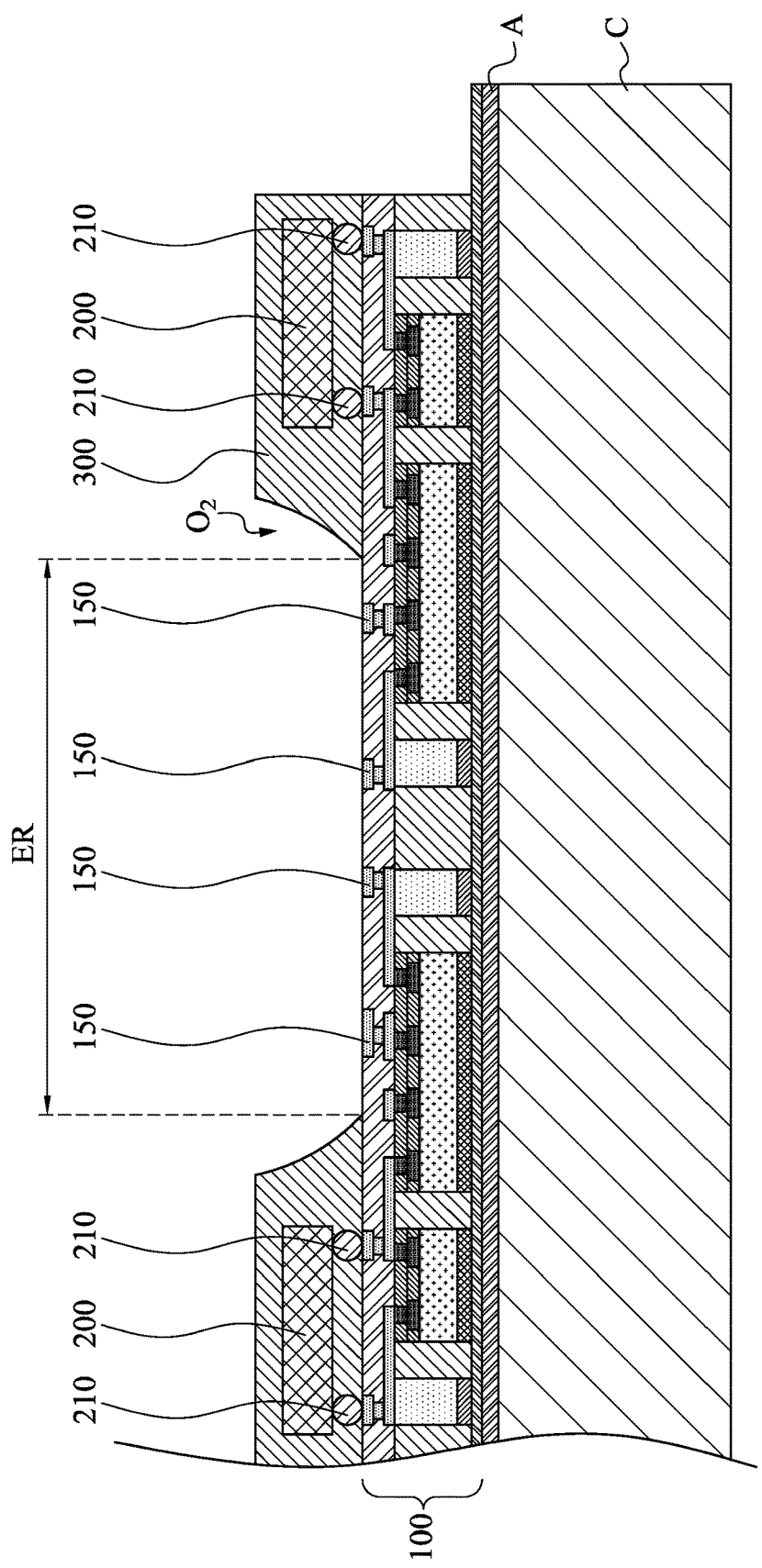

Next, a molding material 300 is injected into space defined by the mold chase M. The molding material 300 is in a liquid form and flows. The molding material 300 may be in contact with the top surface of the TIV package 100, and may be in contact with the external connectors 210, the top surfaces, the bottom surfaces and the sidewalls of the second semiconductor devices 200. The top surface of the molding material 300 may be higher than the top surfaces of the second semiconductor devices 200, and the second semiconductor devices 200 may thus be fully encapsulated in the molding material 300. The molding material 300 is then cured, for example, in a thermal curing process, although other curing methods may be used. The mold chase M may then be taken away. After the mold chase M is taken away, the resulting structure is shown in FIG. 14, in which the molding material 300 has at least one opening $O_2$ therein, and the region ER is exposed by the opening $O_2$ of the molding material 300.

In some embodiments, the molding material 300 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 13:
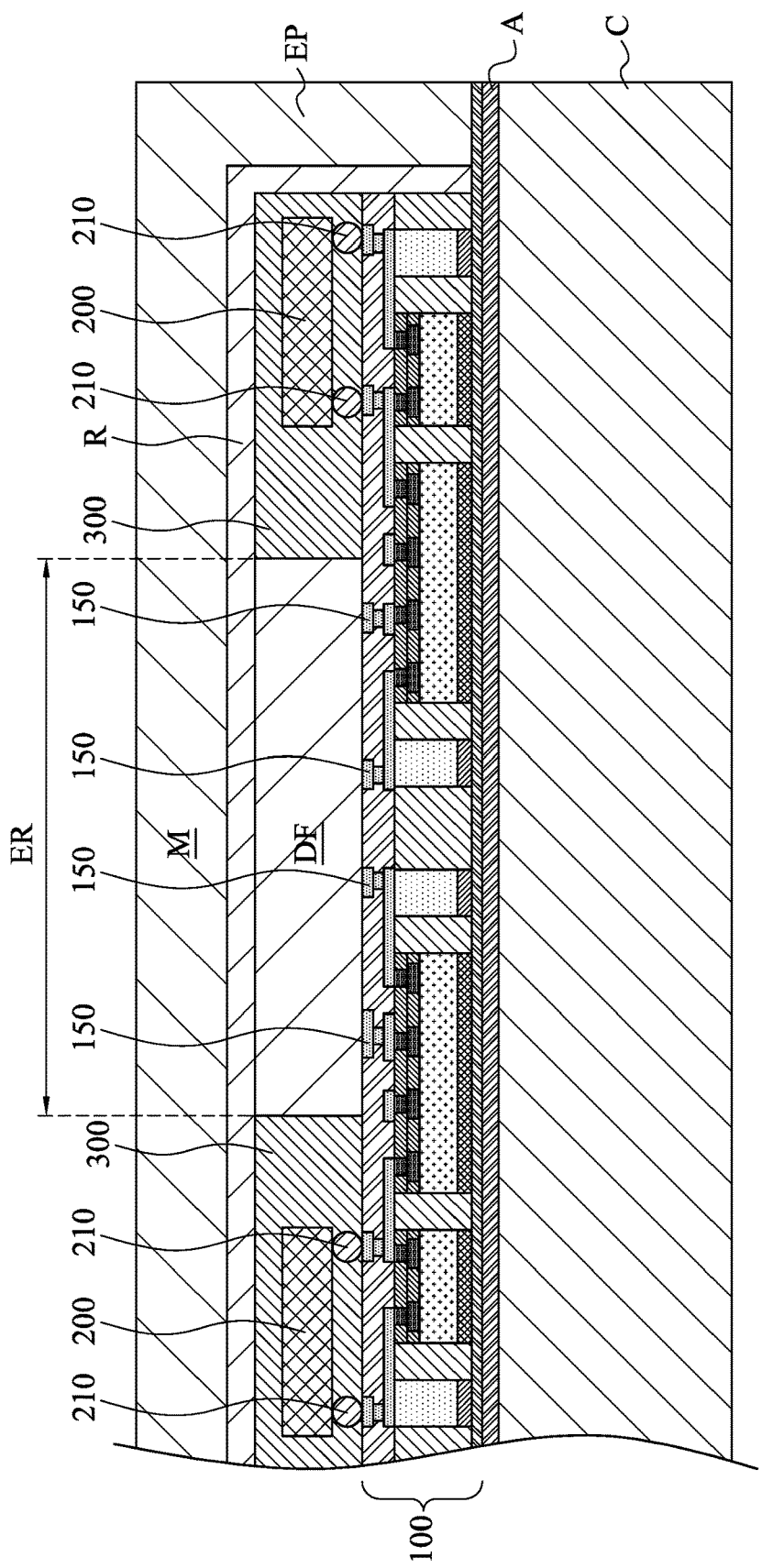

In alternative embodiments, referring to FIG. 13, before placement of a mold chase M, a photo resist DF is applied over the top surface of the TIV package 100 and is then patterned by a photolithography process. As a result, the patterned photo resist DF is formed on the region ER where electronic components 400 (FIG. 18) are to be placed. In some embodiments, the photo resist DF is, for example, a dry film photo resist sheet. Then, the mold chase M is placed on, and is pressed against the TIV package 100 and the carrier C, for example, through clamping. In the embodiments shown in FIG. 13, the mold chase M may have no protrusion that extends down to be pressed against the region ER. Next, a molding material 300 is injected into space defined by the mold chase M. The molding material 300 is then cured, for example, in a thermal curing process, although other curing methods may be used. The mold chase M may then be taken away, and the photo resist DF may then be removed from the region ER.

Figure 15:
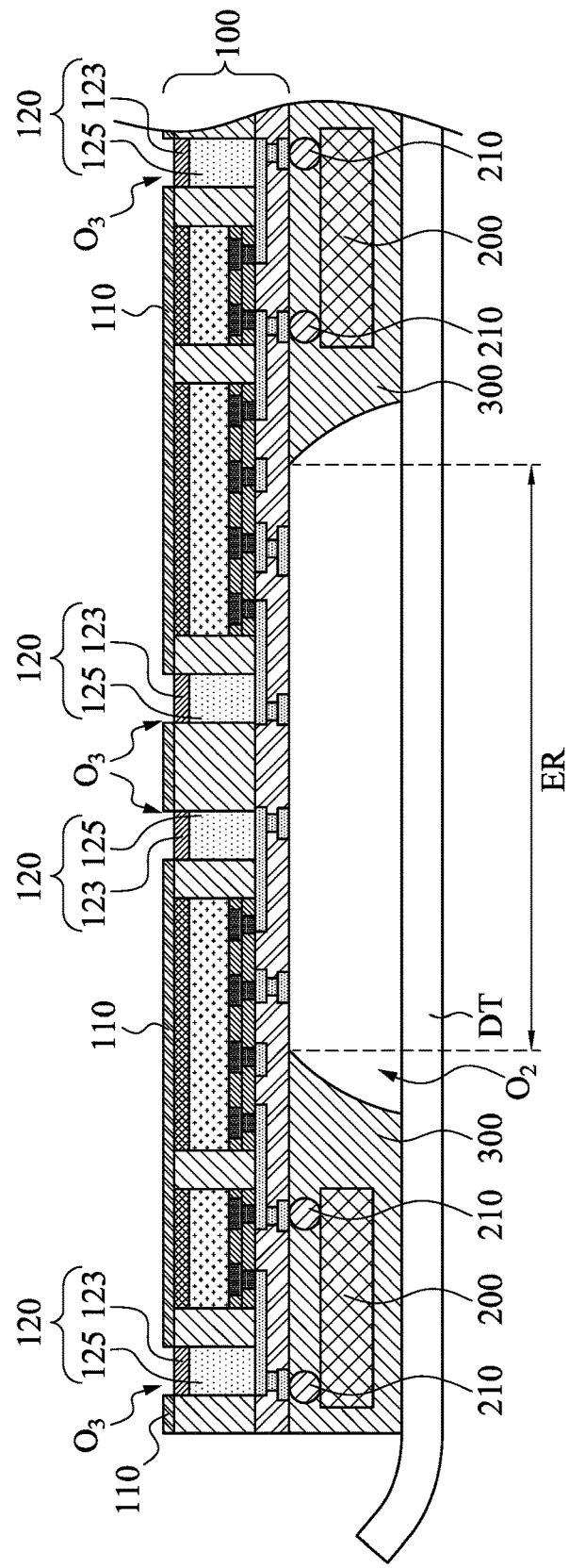

Next, the TIV package 100 is de-bonded from the carrier C. The adhesive layer A is also cleaned from the TIV package 100. As a result of the removal of the adhesive layer A, the buffer layer 110 is exposed. Referring to FIG. 15, the TIV package 100 with the second semiconductor devices 200 and the molding material 300 thereon is further adhered to a dicing tape DT, wherein the molding material 300 faces toward, and may contact, the dicing tape DT. In some embodiments, a laminating film (not shown) is placed onto the exposed buffer layer 110, wherein the laminating film may include SR, ABF, backside coating tape, or the like. In alternative embodiments, no laminating film is placed over the buffer layer 110.

Furthermore, referring to FIG. 15, openings $O_3$ are formed in the buffer layer 110 and the laminating film. In accordance with some embodiments, the openings $O_3$ are formed through laser drill, although photolithography processes may also be used. Meanwhile, the part of the buffer layer 110, which is in contact with the edge portion EP (FIG. 12) of the mold chase M (FIG. 12) before the mold chase M (FIG. 12) is taken away, is removed by the laser drill as well. The TIVs 120 are respectively exposed through the openings $O_3$. In the embodiments wherein the seed layer 123 includes a titanium layer, an etch step is performed to remove the titanium layer, so that the copper layer of the seed layer 123 is exposed. Otherwise, if the seed layer 123 does not include titanium, the etch step is skipped.

Figure 16:
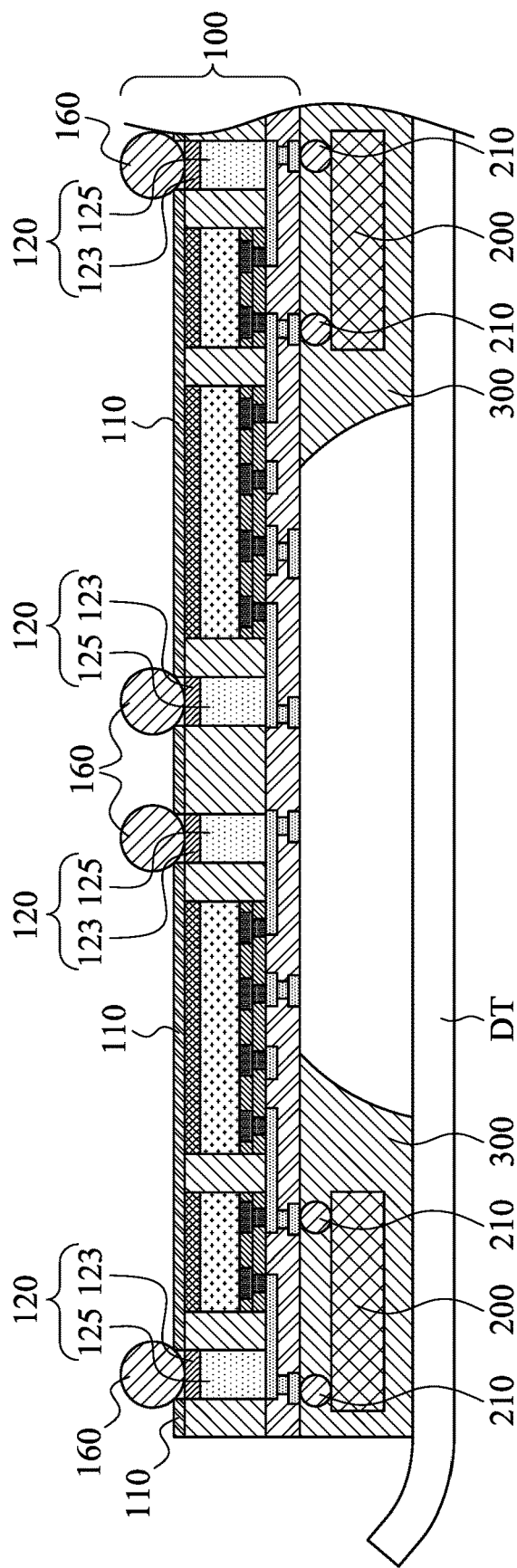

Next, referring to FIG. 16, electrical connectors 160 are formed on the exposed TIVs 120. The formation of the electrical connectors 160 may include placing solder balls on the exposed TIVs 120, and then reflowing the solder balls. In alternative embodiments, the formation of the electrical connectors 160 includes forming solder paste regions over the exposed TIVs 120.

Figure 17:
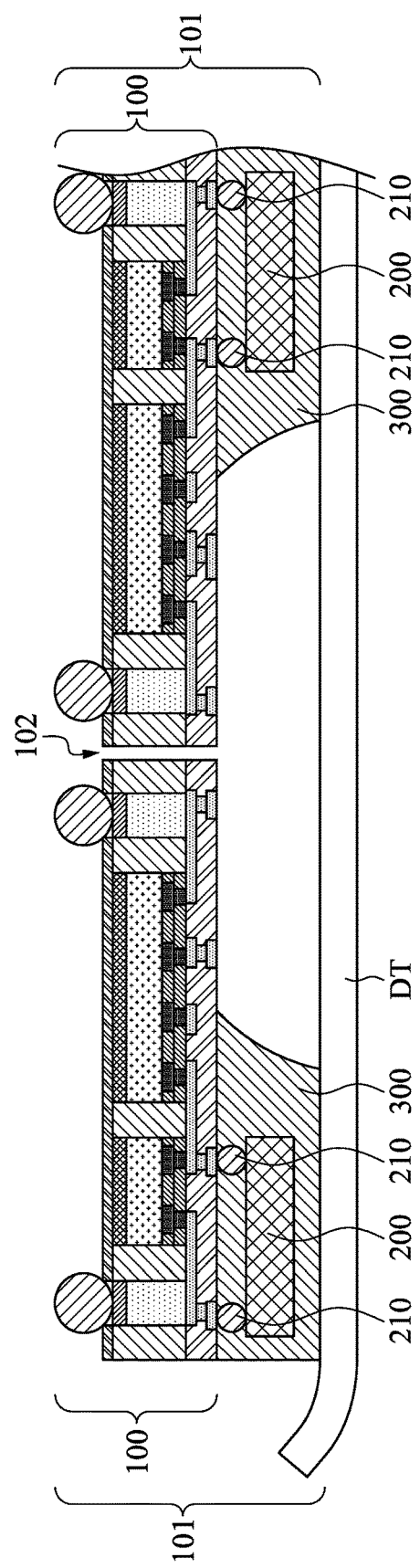

Next, referring to FIG. 17, a singulation process is performed to saw a combination of the TIV package 100, the second semiconductor devices 200, and the molding material 300 into a plurality of package structures 101. The package structures 101 may be separated along at least one singulation line 102 to form individual package structures 101 in some embodiments of the present disclosure.

Figure 18:
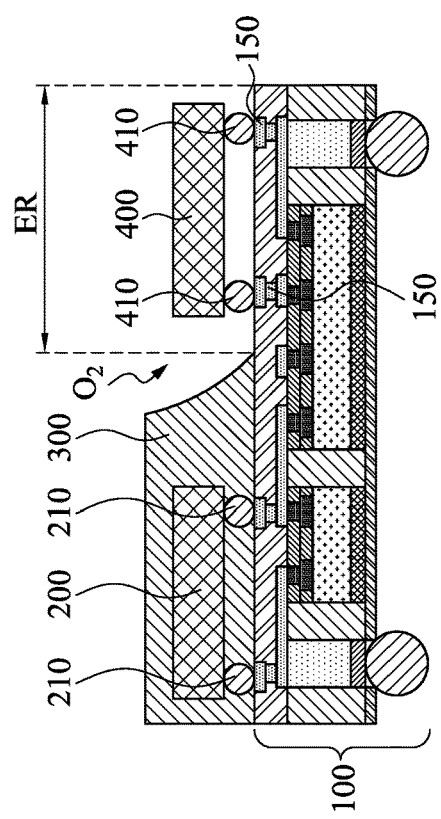

Next, referring to FIG. 18, at least one electronic component 400 is attached to the region ER of the TIV package 100 that is exposed by the opening $O_2$ of the molding material 300. The electronic component 400 attached to the region ER is disposed in the opening $O_2$ of the molding material 300. External connectors 410 of the electronic component 400 are bonded to some exposed portions of the RDLs 150. In some exemplary embodiments, the electronic component 400 is, for example, a sensor, such as a sound sensor, a light sensor, or the like. Since the electronic component 400 is attached to the region ER that is exposed by the opening $O_2$ of the molding material 300, the electronic component 400 is external to the molding material 300. When the electronic component 400 is a sound sensor, a light sensor, or the like, the chance that the molding material 300 hinders sound or light to be sensed by the electronic component 400 can be reduced. In this way, the efficiency of operation of the electronic component 400 is maintained. In some embodiments, the electronic component 400 is attached to the region ER of the TIV package 100 after the singulation process. In alternative embodiments, the electronic component 400 is attached to the region ER of the TIV package 100 before the singulation process.

Figure 19:
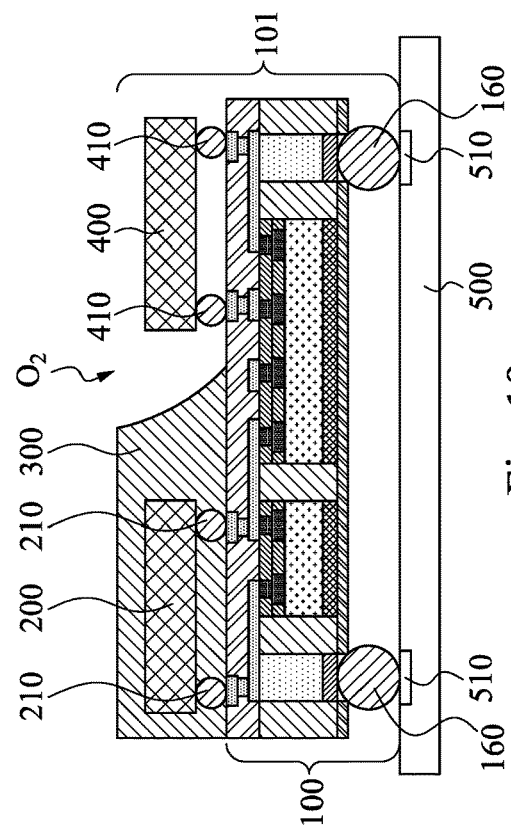

Referring to FIG. 19, the package structures 101 with the electronic component 400 thereon is attached to a substrate 500. The electrical connectors 160 of the TIV package 100 are bonded to some bonding pad 510 of the substrate 500. The substrate 500 is, for example, a printed circuit board.

Figure 20:
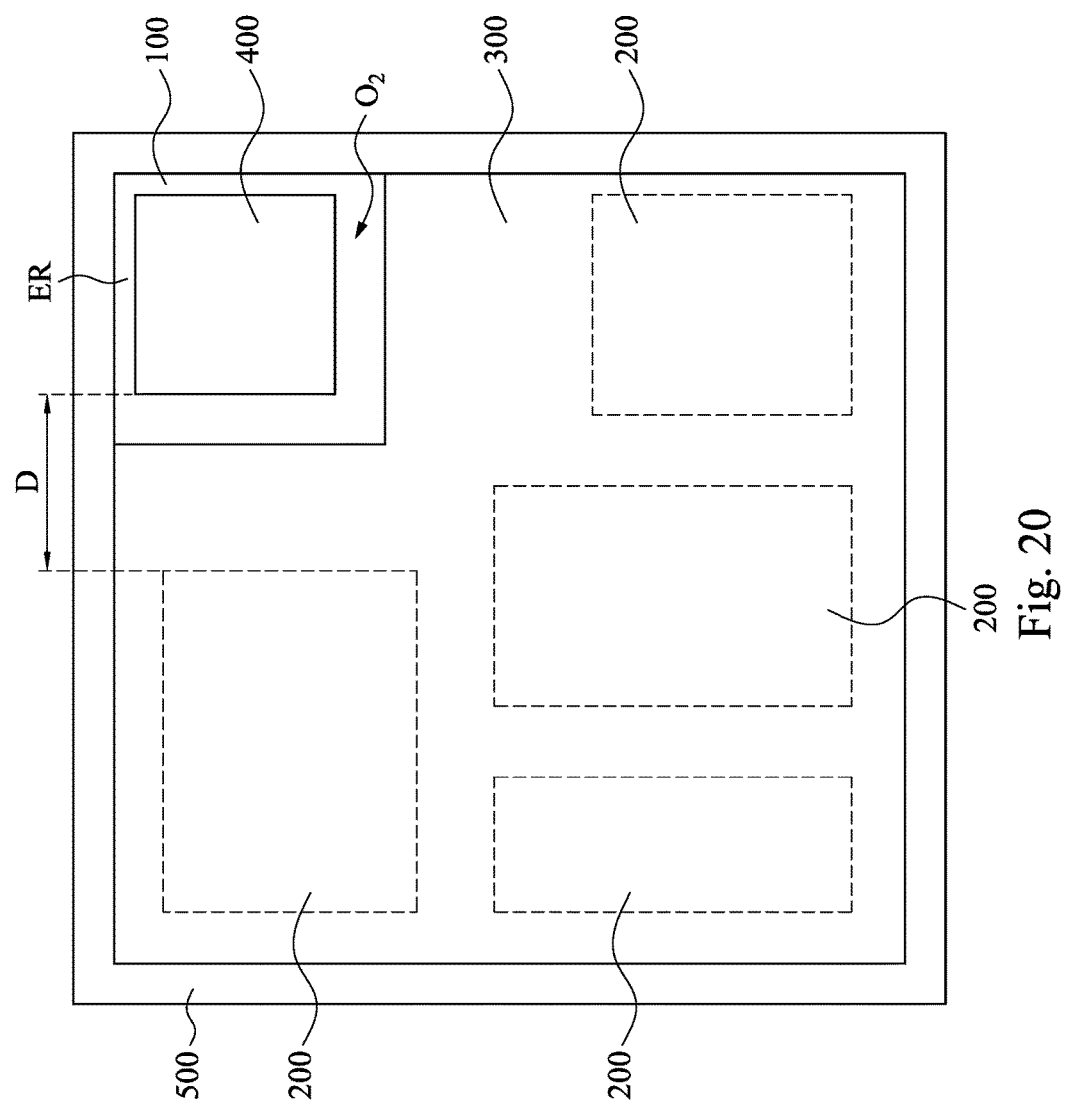
FIG. 20 is a top view of the structure shown in FIG. 19.

FIG. 20 is a top view of the structure shown in FIG. 19. Referring to FIG. 20, the region ER which is exposed by the opening $O_2$ of the molding material 300 abuts at least one edge of the top surface of the TIV package 100. In some embodiments, at least one corner portion of the top surface of the TIV package 100 is exposed by the opening $O_2$ of the molding material 300. That is, the region ER which is exposed by the opening $O_2$ of the molding material 300 overlaps with the corner portion of the top surface of the TIV package 100. Meanwhile, the electronic component 400 is placed on the region ER. That is, the electronic component 400 is placed on the corner portion of the top surface of the TIV package 100. In this way, the electronic component 400 is external to the molding material 300, and thus the efficiency of operation of the electronic component 400 is maintained. In some embodiments, a distance D between the electronic component 400 and the second semiconductor device 200 adjacent to the electronic component 400 is greater than about 1 mm.

Figures 21, 22:
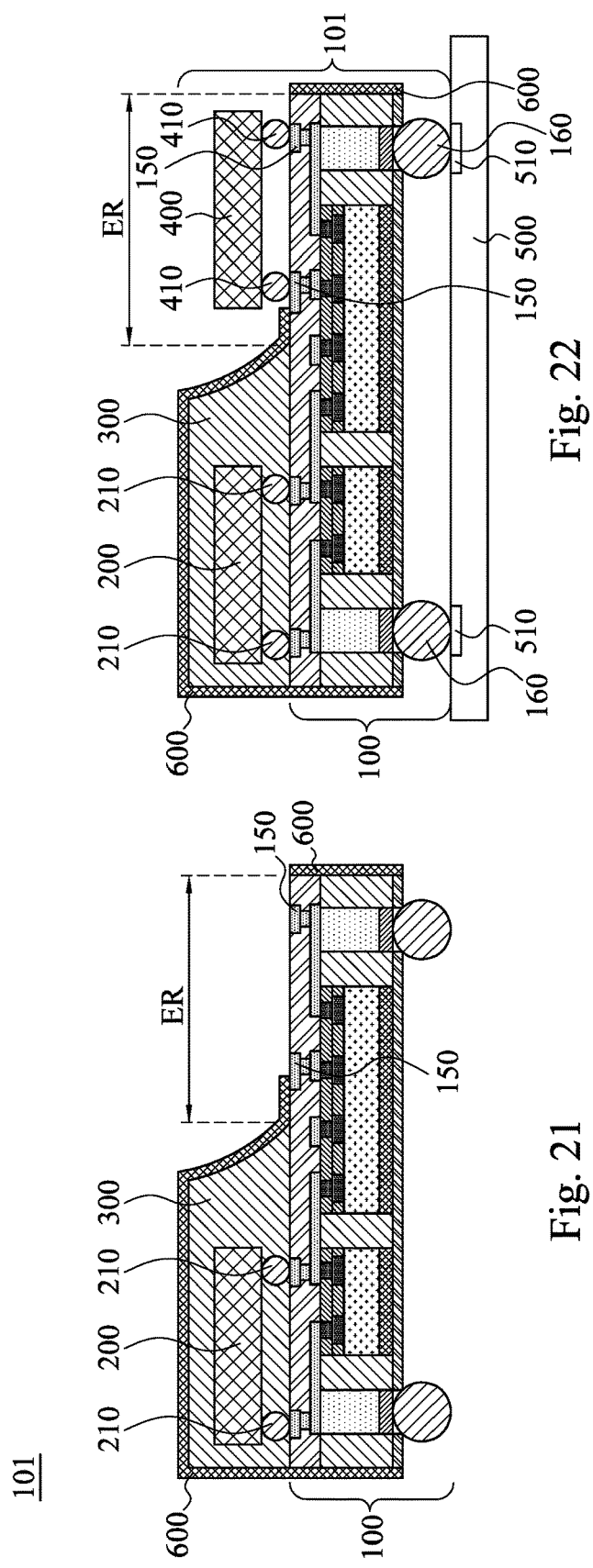
FIGS. 21-22 are cross-sectional views of intermediate stages in the manufacturing of a package structure in accordance with some embodiments of the present disclosure.

Referring to FIG. 21, in some embodiments, before the electronic component 400 is attached to the region ER, a shielding coating 600 is applied at least on the top surface and sidewalls of the molding material 300. In some embodiments, the shielding coating 600 is further applied on the sidewalls of the TIV package 100. The shielding coating 600 is made of metal, such as stainless steel, copper containing materials, indium containing materials or the like. In some embodiments, the shielding coating 600 is applied by spraying.

Figure 23:
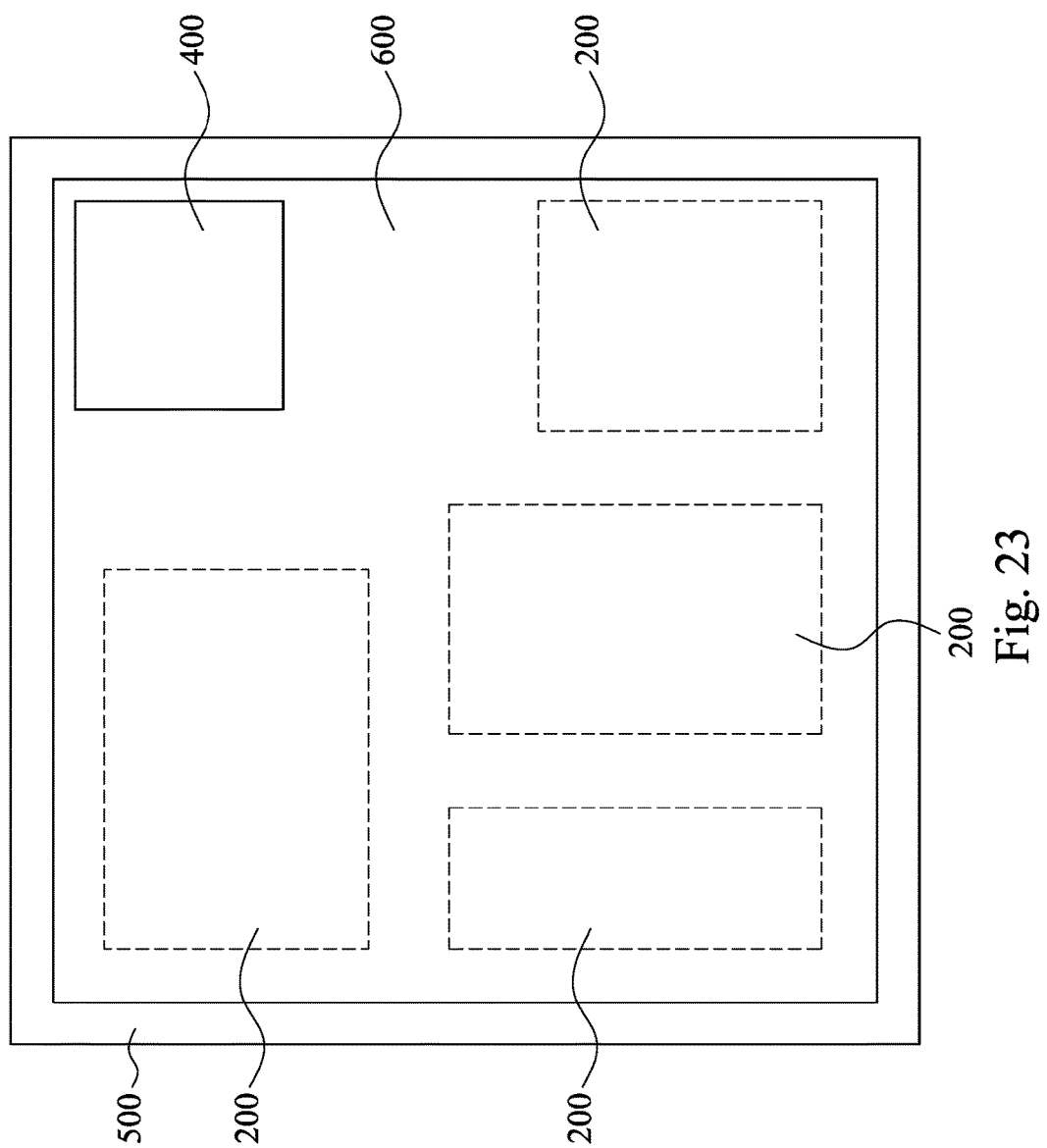
FIG. 23 is a top view of the structure shown in FIG. 22.

Then, a portion of the shielding coating 600 on the region ER of the TIV package 100 is removed. In accordance with some embodiments, removal of said portion of the shielding coating 600 on the region ER is performed through laser drill, although photolithography processes may also be used. In some embodiments, the shielding coating 600 is electrically connected to ground, for example, through at least one exposed portion of the RDLs 150. After the shielding coating 600 is formed, at least one electronic component 400 is attached to the region ER of the TIV package 100, and the TIV package 100 with the second semiconductor device 200, the molding material 300, and the electronic component 400 thereon is attached to a substrate 500. The resulting structure is shown in FIGS. 22 and 23, in which FIG. 23 is a top view of the structure shown in FIG. 22.

Figure 24:
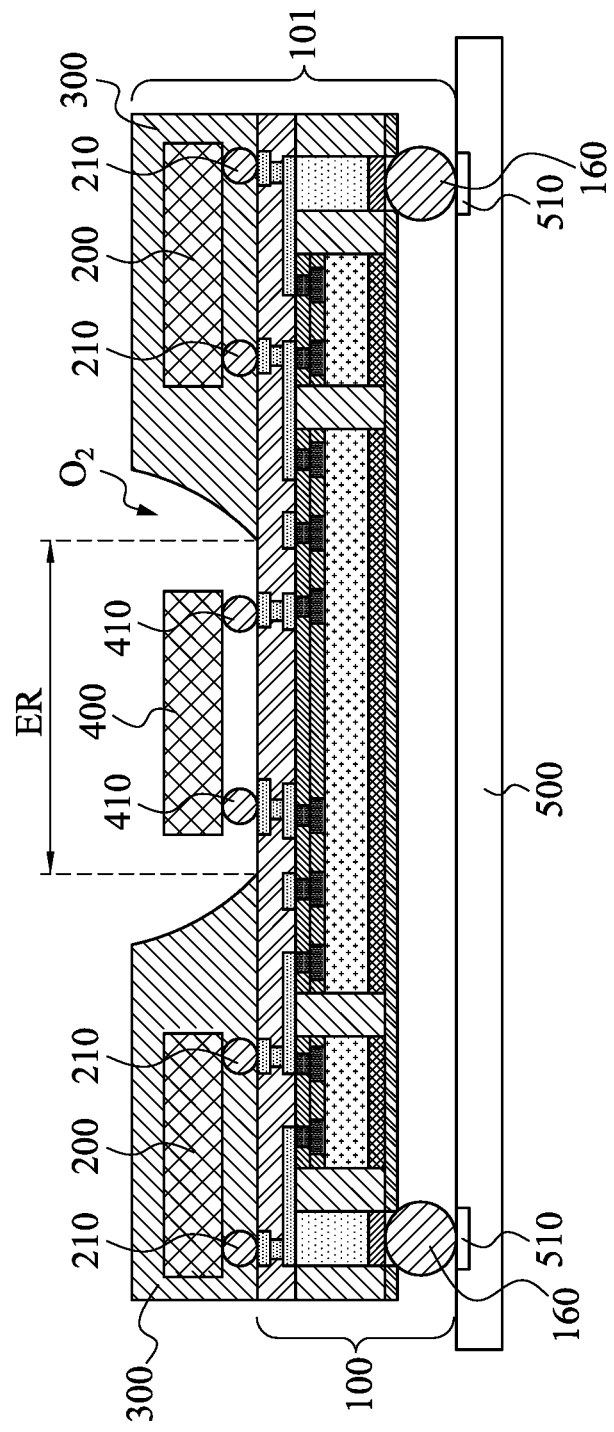
FIG. 24 is a cross-sectional view of a package structure in accordance with some embodiments of the present disclosure.
Figure 25:
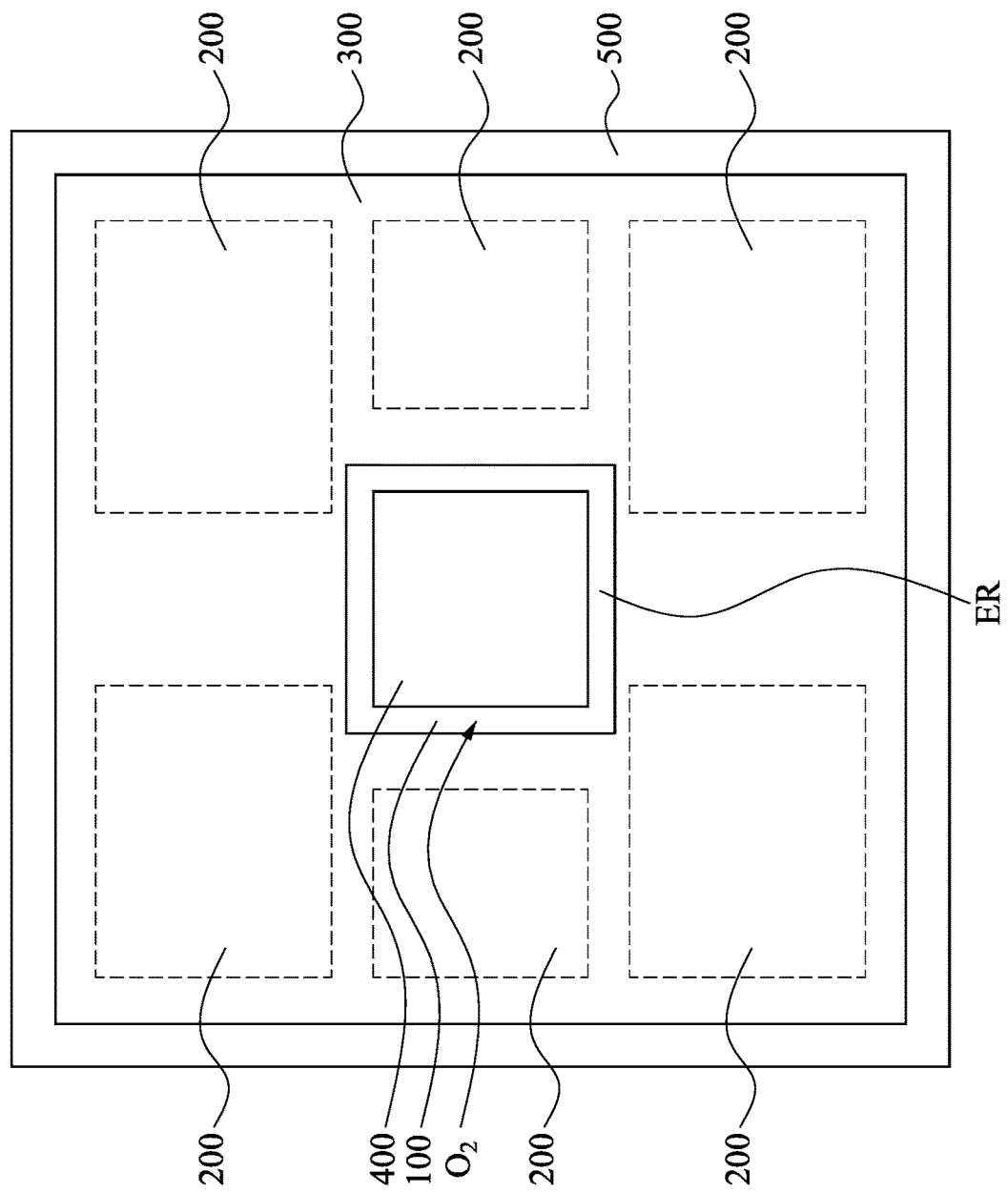
FIG. 25 is a top view of the structure shown in FIG. 24.

Reference is made to FIGS. 24 and 25, in which FIG. 25 is a top view of the structure shown in FIG. 24. In some embodiments, the opening $O_2$ of the molding material 300 is located away from the perimeter of the top surface of the TIV package 100. As a result, when the electronic component 400 is placed in the opening $O_2$ of the molding material 300, the electronic component 400 is surrounded by the molding material 300 with the electronic component 400 being independent of the molding material 300.

Figure 26:
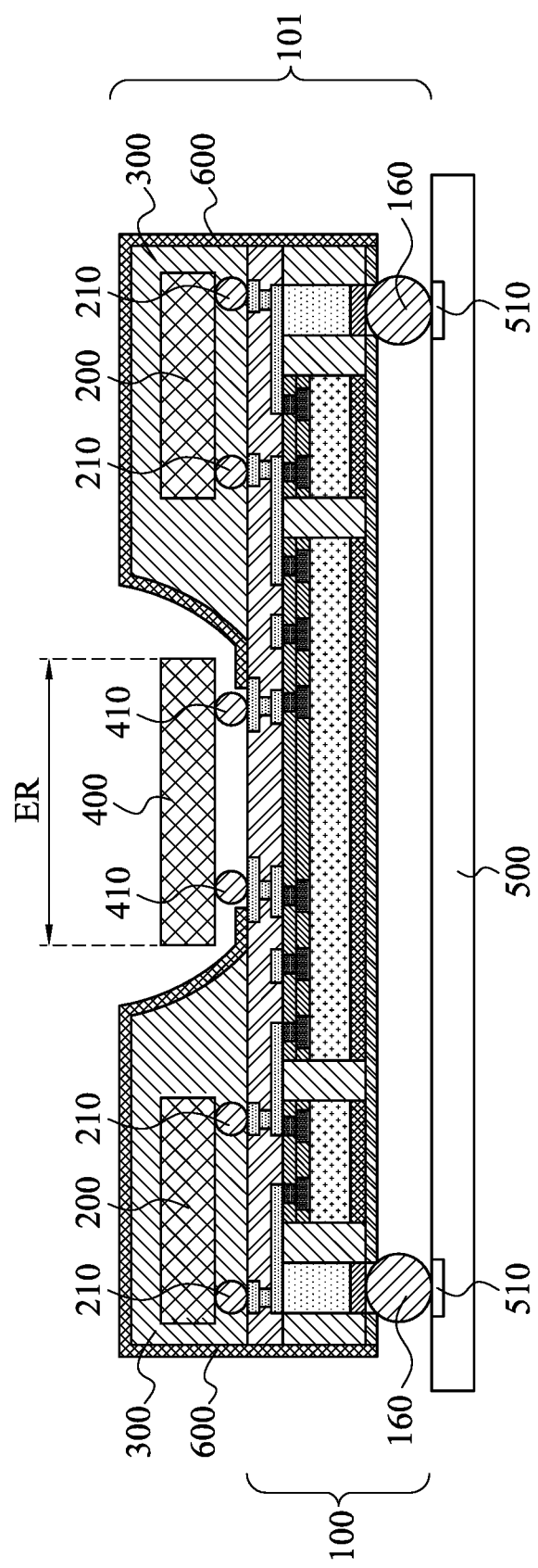
FIG. 26 is a cross-sectional view of a package structure in accordance with some embodiments of the present disclosure.
Figure 27:
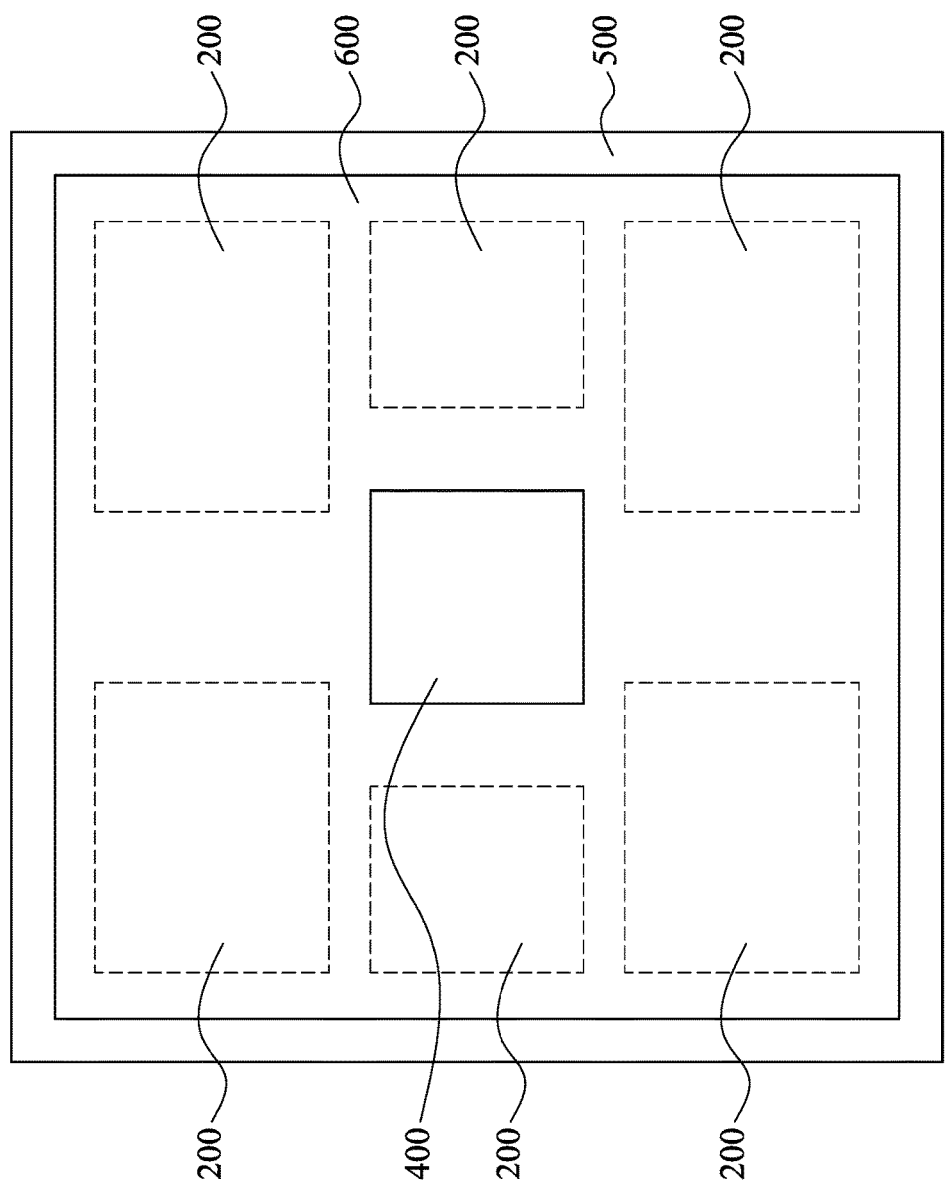
FIG. 27 is a top view of the structure shown in FIG. 26.

Reference is made to FIGS. 26 and 27, in which FIG. 27 is a top view of the structure shown in FIG. 26. The difference between the embodiments shown in FIGS. 26 and 27 and the embodiments shown in FIGS. 24 and 25 includes that the structure shown in FIGS. 26 and 27 further includes a shielding coating 600. The shielding coating 600 is formed at least on the top surface and sidewalls of the molding material 300. In some embodiments, the shielding coating 600 is further formed on the sidewalls of the TIV package 100. Similar to the embodiments shown in FIGS. 21 and 22, the shielding coating 600 is electrically connected to ground, for example, through at least one exposed portion of the RDLs.

In some embodiments of the present disclosure, the package structure has at least one electronic component external to the molding material of the package structure. When the electronic component is a sound sensor, a light sensor, or the like, the chance that the molding material hinders sound or light to be sensed by the electronic component can be reduced. In this way, the efficiency of operation of the electronic component is maintained.

According to various embodiments of the present disclosure, a package structure includes a package, at least one second molding material, and at least one electronic component. The package includes at least one first semiconductor device therein, a first molding material, at least one dielectric layer and at least one redistribution line. The first molding material is at least in contact with at least one sidewall of the first semiconductor device. The dielectric layer is over the first semiconductor device and the first molding material. The redistribution line is present at least partially in the dielectric layer and is electrically connected to the first semiconductor device. The second molding material is present on the package. The electronic component is present on the package and is external to the second molding material.

According to various embodiments of the present disclosure, a package structure includes a package, at least one second semiconductor device and a conductive feature. The package has a top surface and includes at least one first semiconductor device therein, a first molding material, at least one dielectric layer and at least one redistribution line. The first molding material is at least in contact with at least one sidewall of the first semiconductor device. The dielectric layer is over the first semiconductor device and the first molding material. The redistribution line is present at least partially in the dielectric layer and is electrically connected to the first semiconductor device. The second semiconductor device is present on the top surface of the package and has an external connector bonded to the redistribution line. The conductive feature is present in the first molding material and is electrically connected to the redistribution line.

According to various embodiments of the present disclosure, a method for manufacturing a package structure includes forming a package, disposing at least one second semiconductor device on a top surface of the package, molding the second semiconductor device in a second molding material; and disposing at least one electronic component on the package and external to the second molding material. Forming the package includes forming at least one first semiconductor device therein, forming a first molding material at least in contact with at least one sidewall of the first semiconductor device, forming at least one dielectric layer over the first semiconductor device and the first molding material; and forming at least one redistribution line present at least partially in the dielectric layer and electrically connected to the first semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
   a package comprising:
      at least one first semiconductor device therein;
      a first molding material at least in contact with at least one sidewall of the first semiconductor device;
      at least one dielectric layer over the first semiconductor device and the first molding material; and
      at least one redistribution line present at least partially in the dielectric layer and electrically connected to the first semiconductor device;
   at least one second molding material present on the package; and at least one electronic component present on the package and external to the second molding material.

2. The package structure of claim 1, wherein the electronic component is surrounded by the second molding material.

3. The package structure of claim 1, wherein the electronic component is present on a corner portion of the package.

4. The package structure of claim 1, wherein the electronic component is a sensor.

5. The package structure of claim 1, wherein the second molding material has a width that decreases as a distance from the package increases.

6. The package structure of claim 1, wherein the package further comprises:
   at least one through via electrically connected to the redistribution line and through the first molding material.

7. A package structure, comprising:
   a package having a top surface and comprising:
      at least one first semiconductor device therein;
      a first molding material at least in contact with at least one sidewall of the first semiconductor device;
      at least one dielectric layer over the first semiconductor device and the first molding material; and
      at least one redistribution line present at least partially in the dielectric layer and electrically connected to the first semiconductor device;
   at least one second semiconductor device present on the top surface of the package and having an external connector bonded to the redistribution line; and
   a conductive feature present in the first molding material and electrically connected to the redistribution line.

8. The package structure of claim 7, further comprising:
   a second molding material covering the second semiconductor device and the top surface of the package, wherein at least a region of the top surface of the package is free from coverage of the second molding material.

9. The package structure of claim 8, further comprising:
   an electronic component over the region of the top surface of the package.

10. The package structure of claim 8, further comprising:
    a shielding coating present on the second molding material.

11. The package structure of claim 10, wherein the second molding material has a curved sidewall, and the shielding coating conformally coats the curved sidewall.

12. The package structure of claim 8, wherein the second molding material has a width that decreases as a distance from the package increases.

13. The package structure of claim 8, wherein the second molding material has a concave sidewall in contact with the top surface of the package.

14. The package structure of claim 10, wherein the shielding coating is further present on at least one sidewall of the package.

15. A method for manufacturing a package structure, the method comprising:
    forming a package, comprising:
       forming at least one first semiconductor device therein;
       forming a first molding material at least in contact with at least one sidewall of the first semiconductor device;
       forming at least one dielectric layer over the first semiconductor device and the first molding material; and
       forming at least one redistribution line present at least partially in the dielectric layer and electrically connected to the first semiconductor device;
    disposing at least one second semiconductor device on a top surface of the package;
    molding the second semiconductor device in a second molding material; and
    disposing at least one electronic component on the package and external to the second molding material.

16. The method of claim 15, wherein molding the second semiconductor device comprises:
    using a mold to define at least one opening in the second molding material to expose a region of the top surface of the package.

17. The method of claim 15, further comprising:
    forming a shielding coating at least on the second molding material.

18. The method of claim 16, wherein molding the second semiconductor device comprises:
    forming a patterned film on the region of the top surface of the package; and
    molding the second semiconductor device in the second molding material after forming the patterned film.

19. The method of claim 18, wherein forming the patterned film comprises:
    forming a photo resist on the top surface of the package; and
    patterning the photo resist by a photolithography process.

20. The method of claim 19, wherein the photo resist is a dry film photo resist sheet.

* * * * *